US006870432B2

(12) United States Patent
Li et al.

(10) Patent No.: US 6,870,432 B2
(45) Date of Patent: Mar. 22, 2005

(54) UNILATERAL COUPLING FOR A QUADRATURE VOLTAGE CONTROLLED OSCILLATOR

(75) Inventors: Shenggao Li, Pleasanton, CA (US); Issy Kipnis, Berkeley, CA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/452,303

(22) Filed: Jun. 2, 2003

(65) Prior Publication Data

US 2004/0251975 A1 Dec. 16, 2004

(51) Int. Cl.[7] .............................................. H03B 27/00
(52) U.S. Cl. ............................. 331/46; 331/48; 331/50; 331/117 FE; 331/117 R; 331/167; 331/2; 331/177 V
(58) Field of Search ............................. 331/46, 48, 50, 331/117 R, 117 FE, 167, 177 V, 36 C, 2

(56) References Cited

U.S. PATENT DOCUMENTS 6,323,736 B2 * 11/2001 Jansson ........................ 331/44
6,608,527 B2 * 8/2003 Moloudi et al. ............. 330/301

* cited by examiner

*Primary Examiner*—Arnold Kinkead
(74) *Attorney, Agent, or Firm*—Buckley, Maschoff & Talwalkar LLC

(57) ABSTRACT

According to some embodiments, unilateral coupling is provided for a quadrature voltage controlled oscillator. For example, a first voltage controlled oscillator may be provided with a 0 degree phase node and a 180 degree phase node. A second voltage controlled oscillator may be provided with a 90 degree phase node and a 270 degree phase node. In addition, the first and second voltage controlled oscillators may be mutually coupled with substantially unilateral cascaded common-source common-gate amplifier coupling devices to create a quadrature voltage controlled oscillator.

24 Claims, 12 Drawing Sheets

UNILATERAL COUPLING FOR A QUADRATURE VOLTAGE CONTROLLED OSCILLATOR

BACKGROUND

A communication system may use in-phase and quadrature-phase clock signals (e.g., four clock signals, each offset in phase by 90 degrees) to receive and/or transmit signals. In some cases, a poly-phase filter using passive Resister-Capacitor (RC) components may be used to generate these clock signals. Such clock signals, however, may not be accurate over a relatively wide frequency band (e.g., the clock signals might only be accurate at or near a single frequency). As another approach, a ring oscillator may be used to generate the clock signals. In this case, the amount of jitter present in the clock signals may be unacceptable.

DETAILED DESCRIPTION

Figure 1:
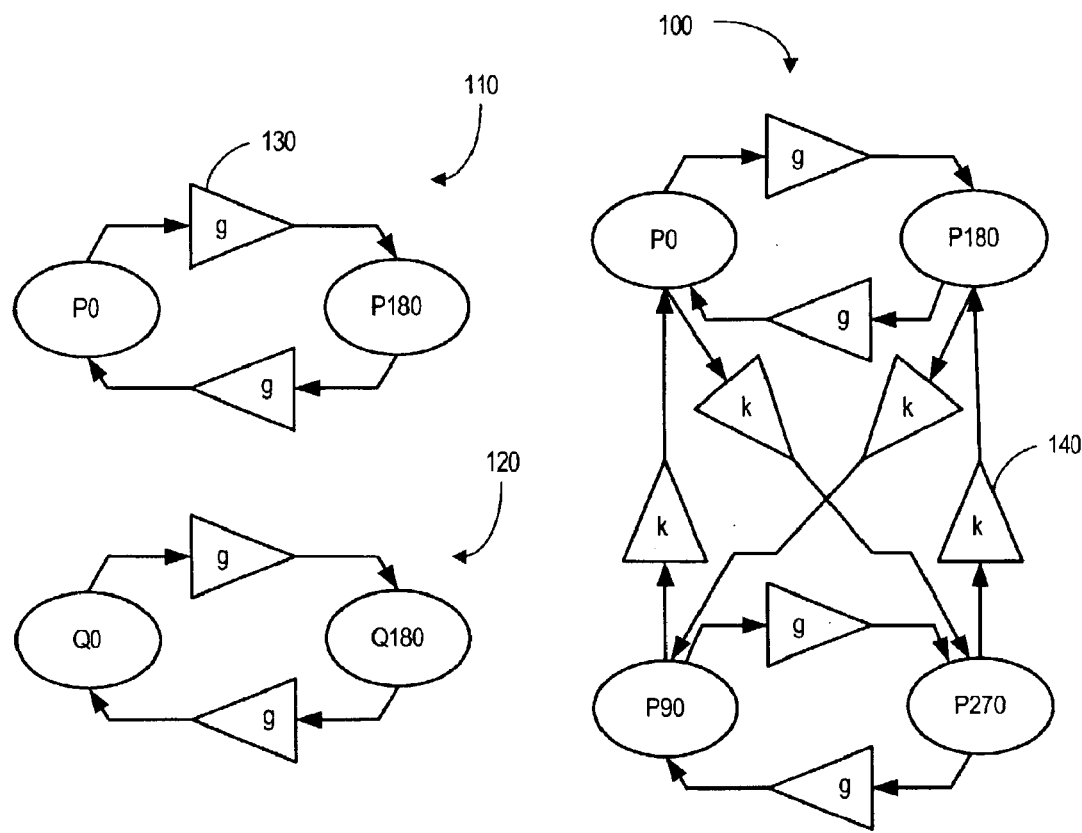
FIG. 1 is a block diagram illustrating a quadrature VCO.

Some embodiments of the present invention are directed to a quadrature Voltage Controlled Oscillator (VCO). For example, FIG. 1 is a block diagram illustrating a quadrature VCO 100 formed using two core VCOs 110, 120.

The core VCOs 110, 120 may use positive feedback to maintain stable oscillation. For example, each core VCO 110, 120 might comprise an Inductor-Capacitor (LC) tank VCO having a first node (P0, Q0) and a second node offset in phase by 180 degrees (P180, Q180), with the two nodes being coupled by gain (g) stages 130 (e.g., from P0 to P180 and from P180 to P0).

The two core VCOs 110, 120 may be mutually coupled with four coupling (k) stages 140 to form the quadrature VCO 100. As a result of this coupling, four equally spaced phase signals may be generated (P0, P90, P180, P270) when the quadrature VCO 100 reaches balance. In particular, the coupling stages 140 may connect: (i) P0 to P270, (ii) P270 to P180, (iii) P180 to P90, and (iv) P90 to P0.

Figure 2:
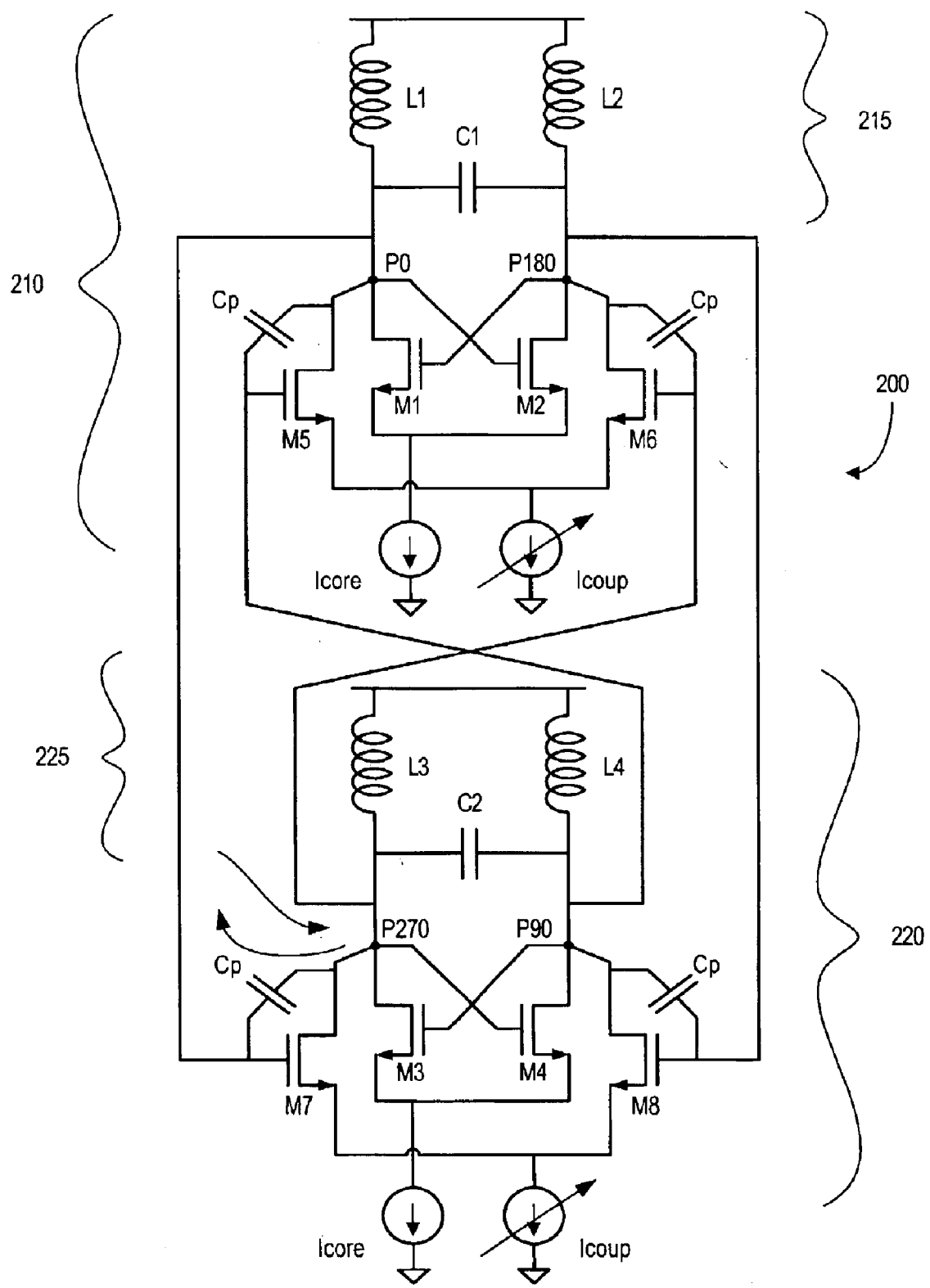
FIG. 2 is an example a quadrature VCO circuit.

FIG. 2 is an example a quadrature VCO circuit 200. As before, two core VCOs 210, 220 are mutually coupled to form a quadrature VCO 200 with four clock signal nodes (P0, P90, P180, P270). In the first core VCO 210, transistors M1, M2 along with an LC tank 215 (L1, L2, and C1) act as the gain stages. Similarly, transistors M3, M4 along with an LC tank 225 (L3, L4, and C2) act as the gain stages in the second core VCO 220.

The coupling stages between the two core VCOs 210, 220 are provided by differential pair transistors M5, M6 and differential pair transistors M7, M8. The bias current for each core VCO 210, 220 is provided by Icore and Icoup. Icore and Icoup alone or together may be used to tune the frequency of the quadrature VCO 200. For example, when Icoup is changed the coupling strength between the two core VCOs 210, 220 will be changed—resulting in a change in the frequency of the quadrature VCO 200. As another approach, capacitor C1 and/or C2 may be used to tune the frequency.

Unfortunately, a quadrature VCO, such as the one illustrated in FIG. 2, may demonstrate two stable operation modes. In one mode, the quadrature VCO may operate at a lower frequency and have a negative gain. In the other mode, the quadrature VCO may operate at a higher frequency and have a positive gain.

For example, in one mode the nodes of the quadrature VCO might be coupled from: (i) P0 to P270, (ii) P270 to P180, (iii) P180 to P90, and (iv) P90 to P0. In the other mode, the nodes of the quadrature VCO might be coupled from: (i) P0 to 90, (ii) P90 to P180, (iii) P180 to P270, and (iv) P270 to P0. In effect, the quadrature VCO may demonstrate bi-directional coupling (as illustrated by the arrows near P270 in FIG. 2).

Either of these modes might become dominant in the quadrature VCO, depending in part on the quality factor of the LC tanks, the core VCO currents, and the conditions present when power is applied to the circuit. Moreover, the quadrature VCO might jump between the two modes during operation (e.g., if the coupling current Icoup is not strong enough to prevent the jumping). The unpredictable "bi-modal" oscillation of a quadrature VCO may make the circuit unsuitable for many applications.

Quadrature VCO with Unilateral Coupling

Figure 3:
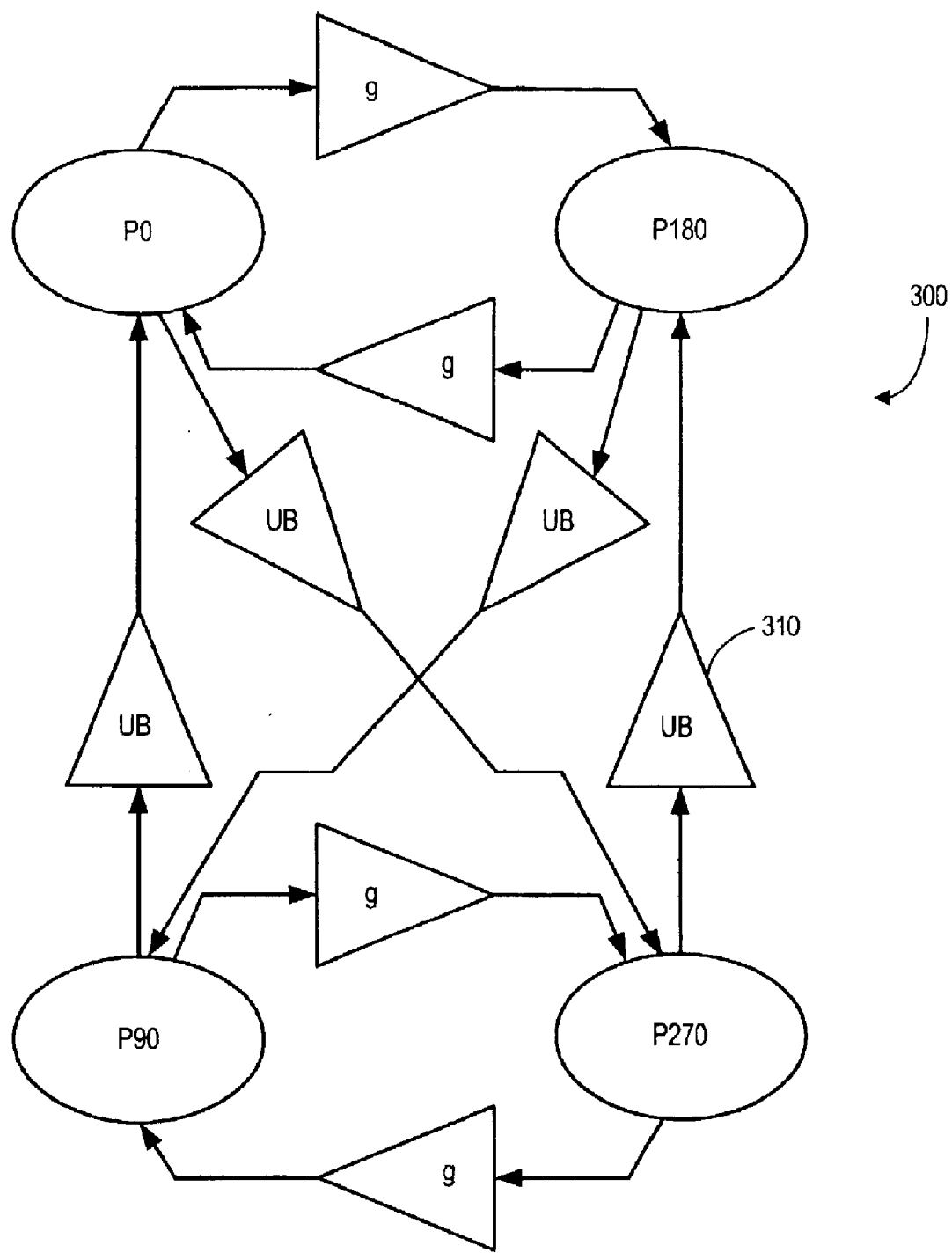
FIG. 3 is a block diagram of a quadrature VCO with unilateral coupling according to some embodiments.

FIG. 3 is a block diagram of a quadrature VCO 300 according to some embodiments. The quadrature VCO 300 includes a first VCO having a 0 degree phase node (P0) and a 180 degree phase node (P180) coupled to each other by gain stages. A second VCO has a 90 degree phase node (P90) and a 270 degree phase node (P270) coupled to each other by gain stages.

According to this embodiment, the two core VCOs are mutually coupled with substantially unilateral coupling devices to create the quadrature VCO 300 (e.g., coupling devices that propagate coupling in one direction significantly more than in the opposite direction).

For example, the coupling devices may comprise Unilateral Buffers (UB) 310 provided from: (i) P0 to P270, (ii) P270 to P180, (iii) P180 to P90, and (iv) P90 to P0. The unilateral coupling devices may let coupling propagate in one direction (e.g., P0 to P270 to P180 to P90 to P0) while preventing coupling in the opposite direction (e.g., P0 to 90 to P180 to P270 to P0). As a result, the likelihood of bi-modal oscillation may be reduced. Note that the quadrature VCO 300 might be suitable for clock generation in a communication device, such as a wireless homodyne radio or a Synchronous Optical Network (SONET) device.

Figure 4:
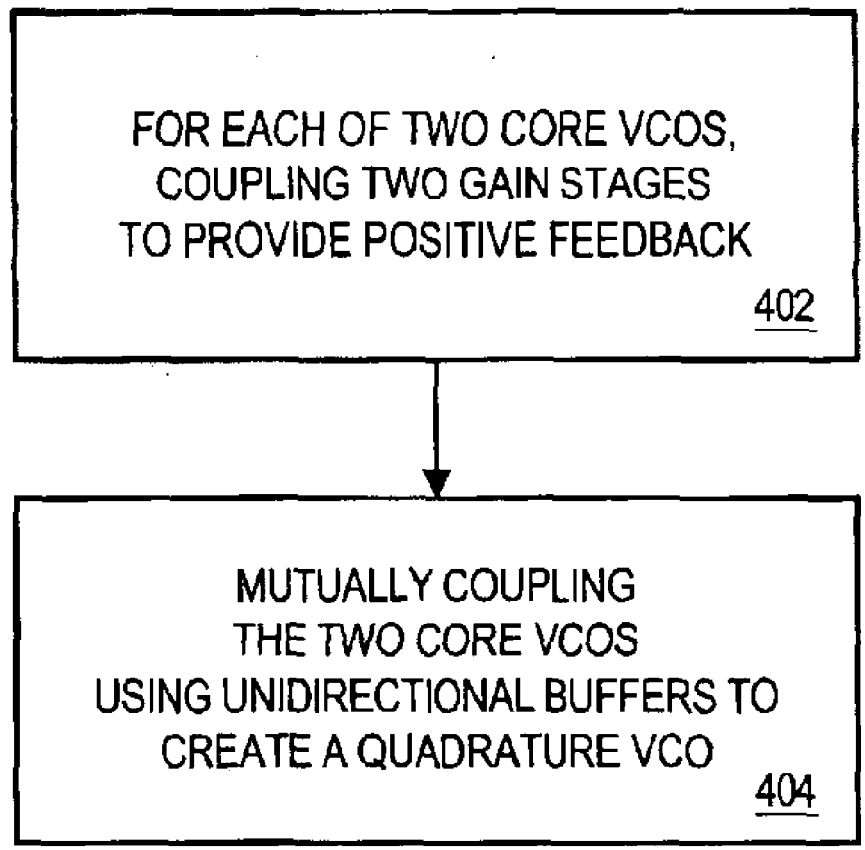
FIG. 4 is a flow chart of a method according to some embodiments.

FIG. 4 is a flow chart of a method according to some embodiments. The flow charts described herein do not necessarily imply a fixed order to the actions, and embodiments may be performed in any order that is practicable. The method of FIG. 4 may be associated with, for example, a quadrature VCO.

At 402, two core VCOs are created by coupling two gain stages to provide positive feedback. At 404, the two core VCOs are mutually coupled using unidirectional buffers to create a quadrature VCO. Because the unidirectional buffers may reduce bi-modal oscillation, the quadrature VCO might, for example, generate clock signals associated with a 10 Giga Hertz (GHz) SONET System on a Chip (SoC) device.

EXAMPLES

Figure 5:
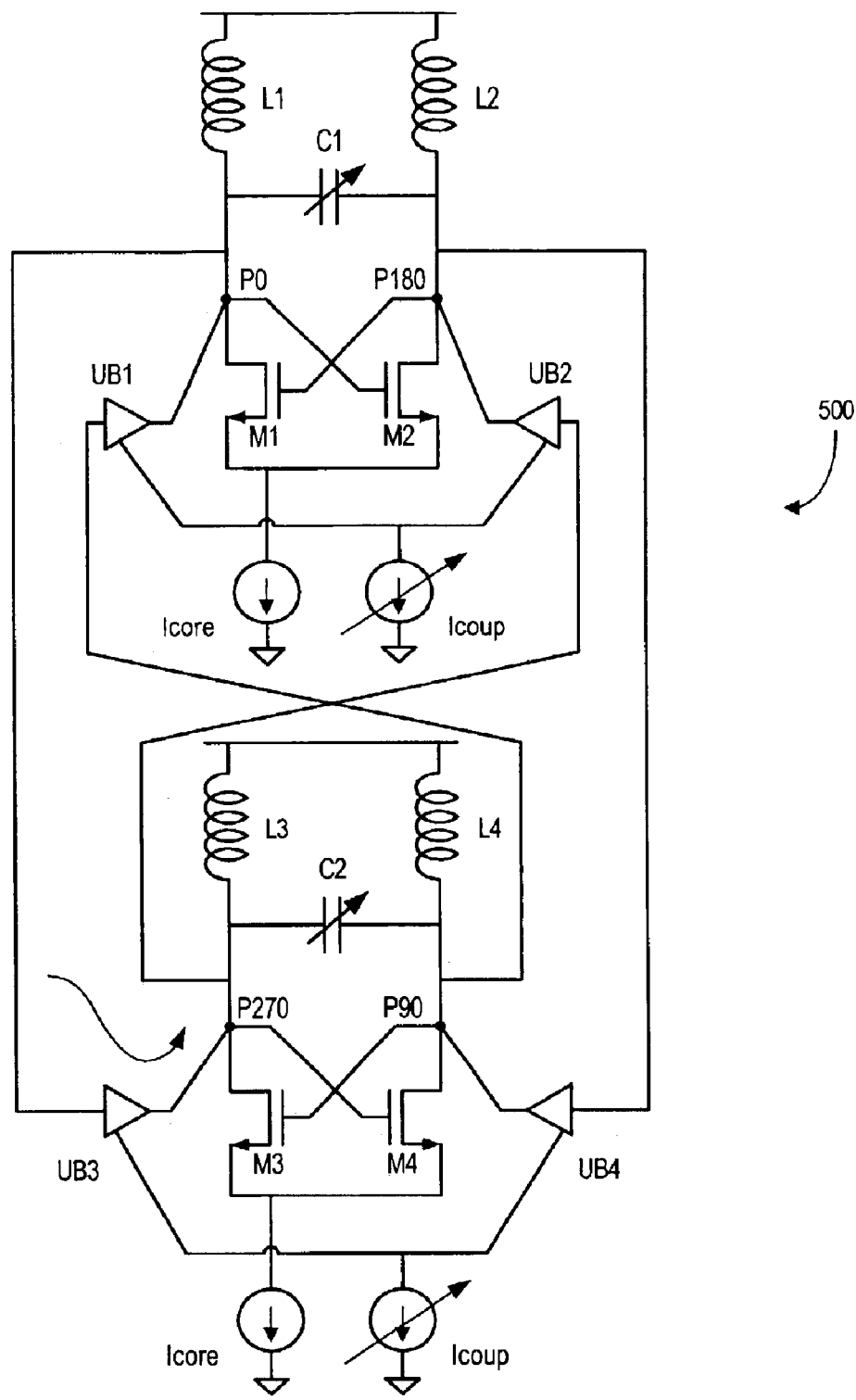
FIG. 5 is an example of a quadrature VCO circuit with unilateral coupling devices according to some embodiments.

FIG. 5 is an example of a quadrature VCO circuit 500 according to some embodiments. Some elements of the circuit 500 may operate as described with respect to FIG. 2. In this case, however, unidirectional buffers UB1 through UB4 act as the coupling devices between the two core VCOs. As a result, coupling may propagate in one direction (e.g., P0 to P270 to P180 to P90 to P0) but not in the opposite direction (e.g., P0 to 90 to P180 to P270 to P0). In effect, the quadrature VCO 500 may avoid bi-directional coupling (as illustrated by the arrow near P270 in FIG. 5).

Figure 6:
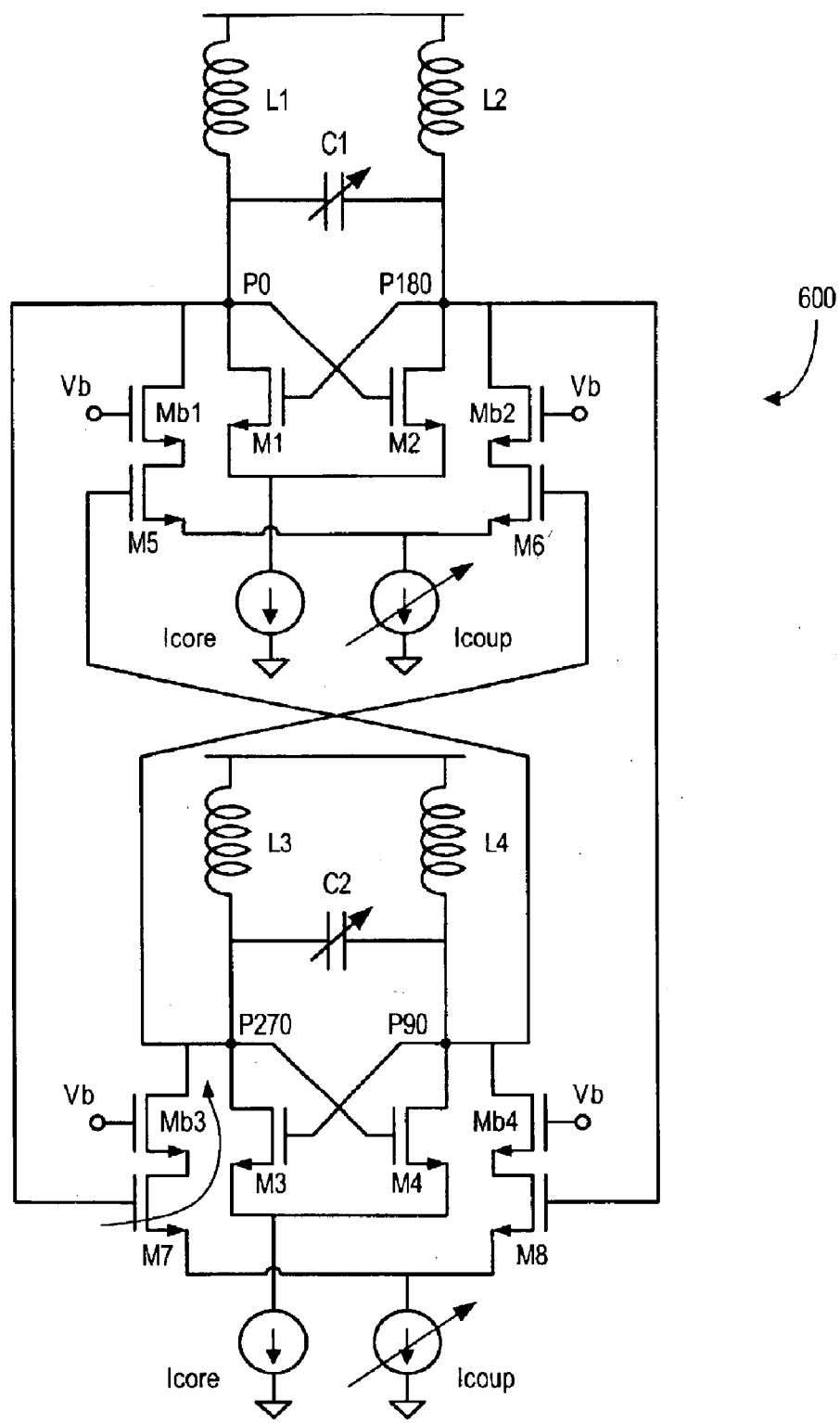
FIG. 6 is an example a quadrature VCO circuit according to some embodiments.

FIG. 6 is an example a quadrature VCO circuit 600 according to some embodiments. As before, transistors M1, M2 along with an LC tank (L1, L2, and C1) act as the gain stages in the first core VCO. Similarly, transistors M3, M4 along with an LC tank (L3, L4, and C2) act as the gain stages in the second core VCO.

According to this embodiment, unilateral coupling between the core VCOs is facilitated using cascaded common-source common-gate amplifiers. In particular, Metal Oxide Semiconductor (MOS) transistors Mb1 through Mb4 have been added on top of the original coupling devices M5 through M8, and each of the four coupling stages is now composed of a cascaded common-source common-gate amplifier that acts as a unilateral buffer. Note that such common-source common-gate amplifiers may exhibit relatively high output impedance and voltage gain.

Consider, for example, the coupling from P0 to P270. In this case, transistors Mb3 and M7 are in a cascaded common-source common-gate configuration, the gate of transistor Mb3 being biased by Direct Current (DC) voltage source Vb. As a result, the signal at P0 will propagate to P270 as would be expected in a common-source common-gate amplifier. Meanwhile, transistor Mb3 will provide significant attenuation in the reverse direction (from P270 to P0). Compared with the convention quadrature VCO described with respect to FIG. 2, the attenuation may be approximately $1/(g_m r_o)$ where $g_m$ represents the transconductance and $r_o$ represents the channel resistance associated with Mb3.

Since coupling will propagate in a single direction, bi-modal oscillation may be reduced (even over process, supply, and/or temperature variations). Moreover, the circuit 600 may exhibit acceptable jitter performance, may be less complex, and may consume less power as compared to an injection-locked quadrature VCO. Such a circuit 600 may allow for higher integration and performance and might be appropriate for an optical or wireless communication SoC device. For example, a 10 GHz SONET/Ethernet transceiver might be integrated in a single chip using Complimentary MOS (CMOS) or BiCMOS technology.

Quadrature VCO Having an Adjustable Center Frequency

Figure 7:
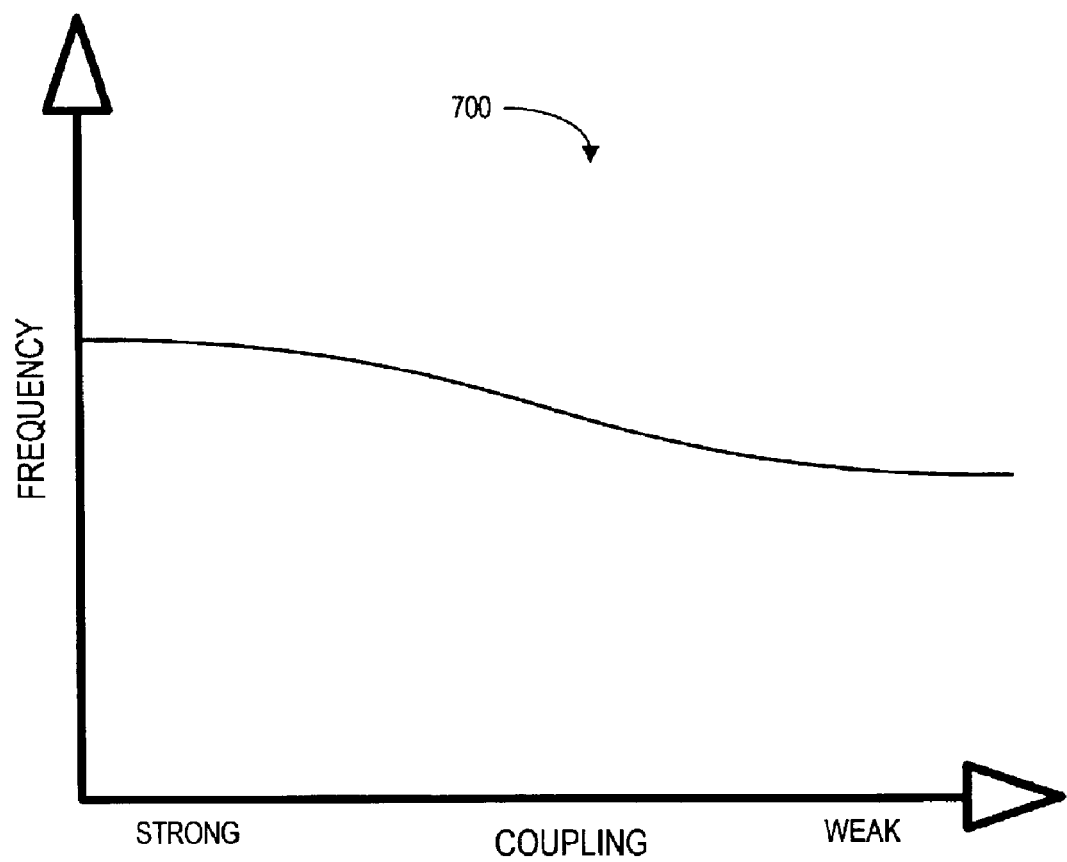
FIG. 7 illustrates a frequency tuning curve for a quadrature VCO.

Note that the frequency at which a quadrature VCO operates may depend on the coupling strength between the two core VCOs. For example, as illustrated by the curve 700 in FIG. 7, the frequency of the quadrature VCO may increase as the coupling strength between the two core VCOs is increased. As a result, the frequency of the quadrature VCO may be tuned by adjusting the coupling strength (e.g., via Icoup as shown in FIG. 6).

In general, the range over which the quadrature VCO can be tuned may be determined by the sharpness of the loop gain Alternating Current (AC) response of the underlying core VCOs, which in turn may be limited by the quality factor of the LC tanks (e.g., the sharpness of the loop gain response may increase with the quality factor of the LC tanks). Thus, to provide a sufficiently large tuning range (e.g., to support clock generation for a communication device), a quadrature VCO might have inductors with a low quality factor and/or a large coupling current. Either measure, however, could introduce an undesirable amount of jitter in the clock signals.

Figure 8:
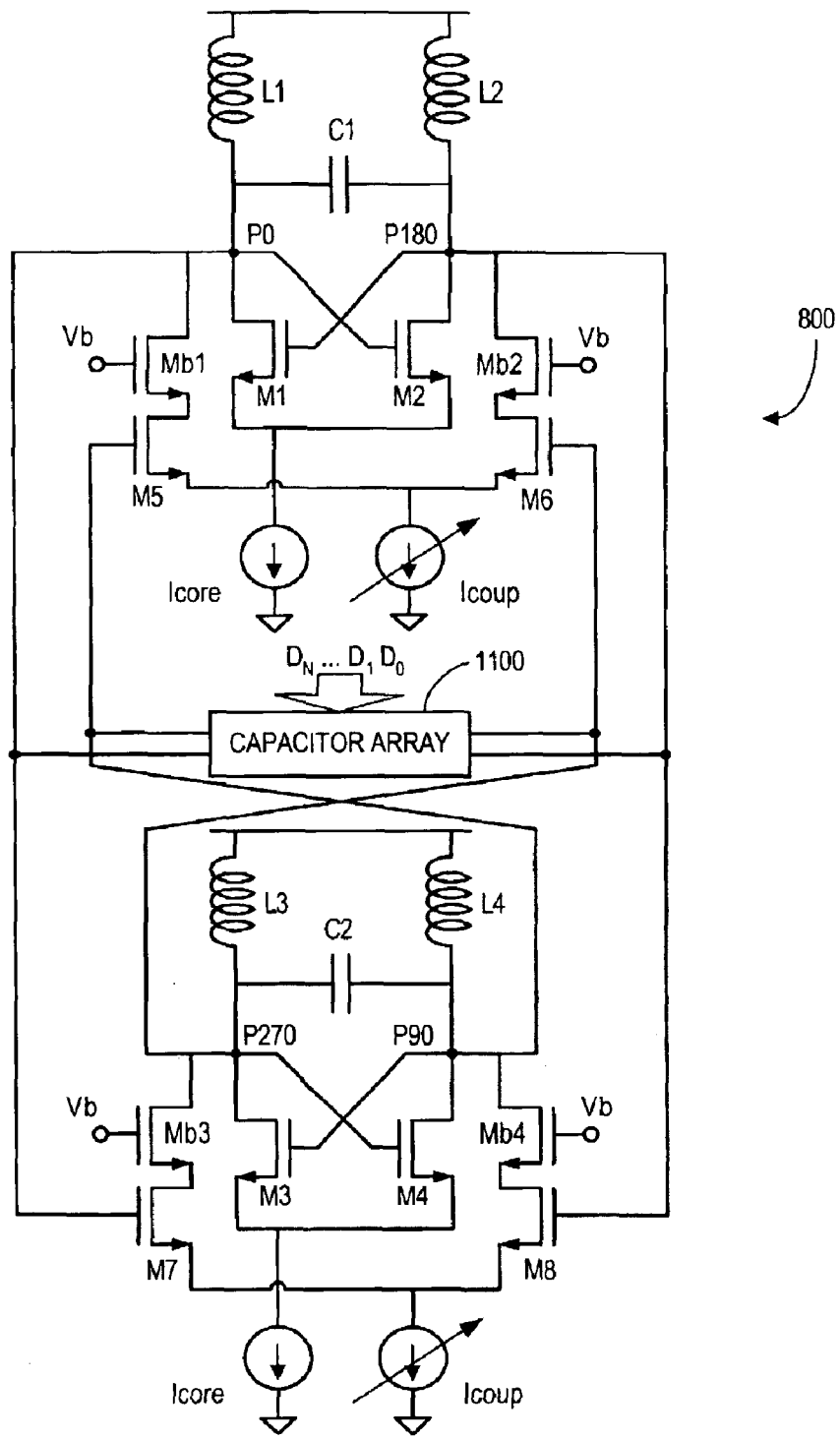
FIG. 8 is an example a quadrature VCO circuit according to some embodiments.

FIG. 8 is an example of a quadrature VCO circuit 800 according to some embodiments. Some elements of the circuit 800 may operate as described with respect to FIG. 6. According to this embodiment, however, a digitally controlled capacitor array 1100 is coupled in parallel with the first and second LC tanks. For example, the capacitor array 1100 may be connected to the four outputs of the quadrature VCO (P0, P90, P180, and P270) and control signals $D_0$ through $D_N$ may determine the amount of capacitance associated with the array 1100.

For example, assume that the capacitor array 1100 receives two control signals ($D_0$ and $D_1$). In this case, control signals of "00," "01," "10," and "11" would each introduce a different amount of capacitance to the circuit 800 (e.g., by switching on various capacitance cells). As a result, four different frequency tuning curves are produced (each with a different center frequency). According to some embodiments, the 0th cell in the capacitor array is used a base cell, and the kth cell is constructed with $2^k$ units of the base cell. Note that the control signals might be binary coded or in other weights and/or coding formats.

Figure 9:
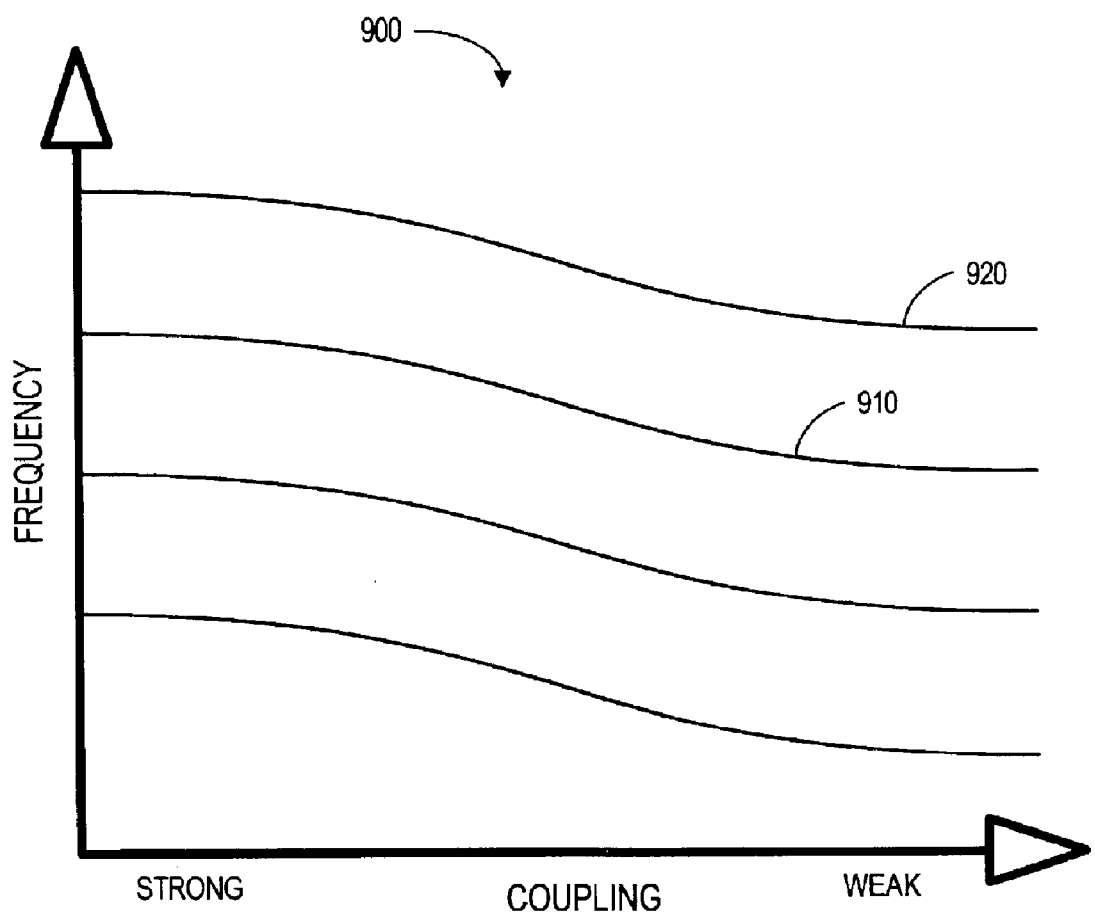
FIG. 9 illustrates multiple frequency tuning curves for a quadrature VCO according to some embodiments.

FIG. 9 illustrates multiple frequency tuning curves 900 for a quadrature VCO according to some embodiments. That is, the circuit 800 of FIG. 8 might exhibit one frequency tuning curve 910 when one set of control signals are provided to the capacitor array 1100 and another frequency tuning curve 920 when another set of control signals are provided to the capacitor array 1100. A particular frequency on the selected tuning curve may then be controlled via Icoup. Note that depending on the design of the circuit 800, the highest frequency of one curve might be associated with the lowest frequency of a neighboring curve (e.g., to provide a large overall frequency range and/or to cover four frequency ranges of interest).

Figure 10:
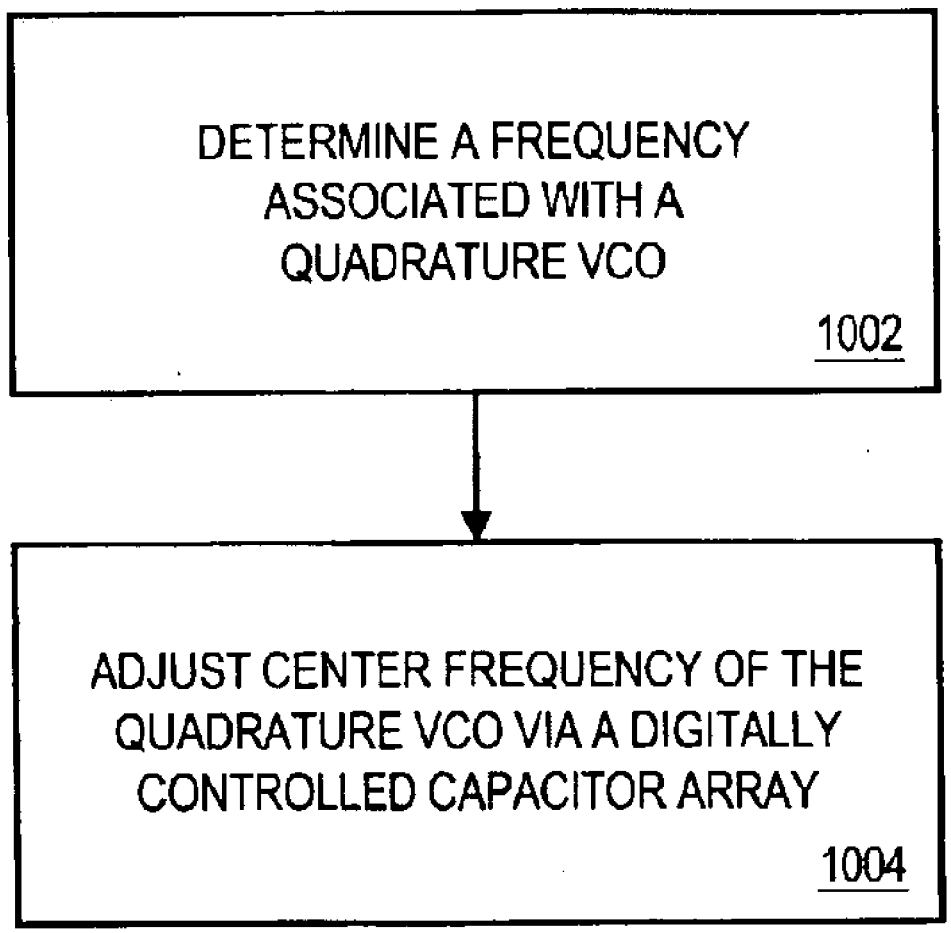
FIG. 10 is a flow chart of a method according to some embodiments.

According to some embodiments, a selection unit (not illustrated in FIG. 8) generates the control signals that are provided to the capacitor array 1100. For example, as illustrated in FIG. 10, the selection unit might determine a frequency associated with a quadrature VCO at 1002 (e.g., by determining a frequency at which the quadrature VCO should operate). The center frequency of the quadrature VCO may then be adjusted as appropriate at 1004 via a digitally controlled capacitor array 1100 (e.g., by setting control signals that select the tuning curve that includes the frequency determined at 1002). That is, the digitally controlled capacitor array 1100 may provide a course frequency adjustment and a variable bias current (e.g., Icoup) may provide a fine frequency adjustment for the quadrature VCO.

By using a digitally switched capacitor array, the range of each frequency tuning curve may be relatively small (e.g., only one frequency band may need to be covered by one curve over process, temperature and supply voltage variations), but the quadrature VCO may still have an acceptable overall tuning range because of the coarse tuning provided by the capacitor array. Moreover, the reduced tuning range of each curve may make it possible to achieve sufficient jitter performance with moderate power consumption. As a result, the approach may be suitable for a lower-power high transistor density communication system (e.g., associated with an optical or wireless communication device).

Figure 11:
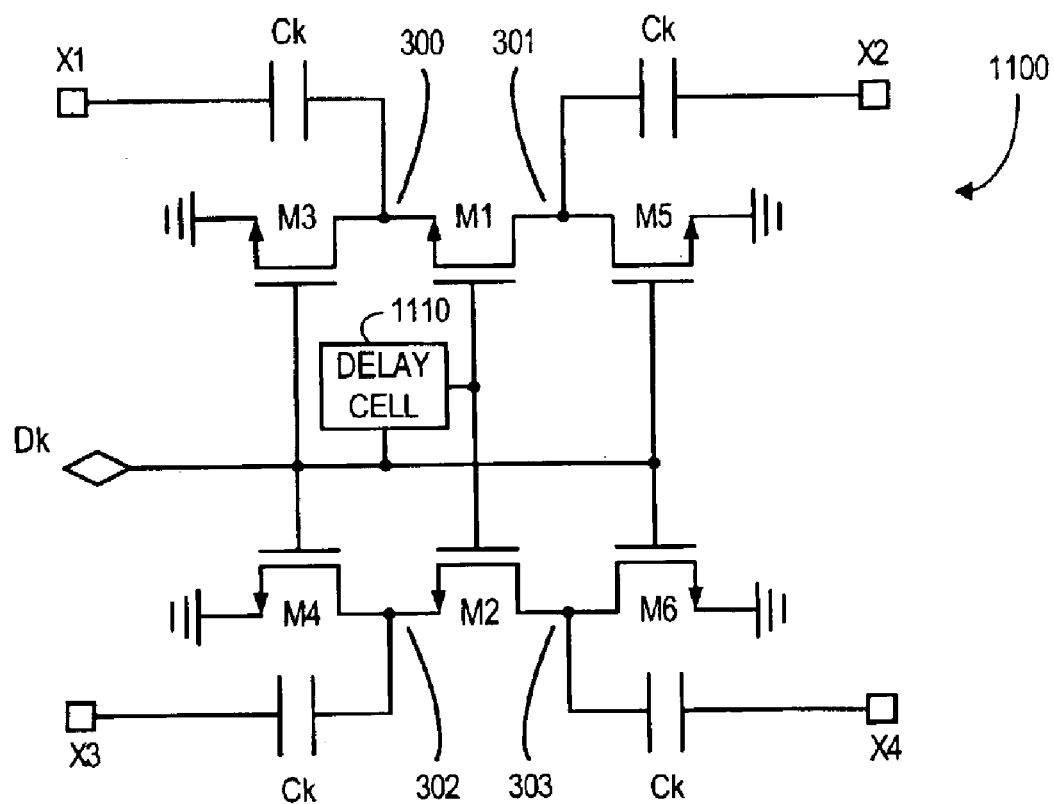
FIG. 11 illustrates a portion of a digitally controlled capacitor array according to some embodiments.

FIG. 11 illustrates a kth cell 1100 of a digitally controlled capacitor array that may be used in a quadrature VCO according to some embodiments. In particular, the cell 1100 comprises a set of digitally switched capacitors that may be switched on (or off) by a control signal $D_k$. Note that the cell 1100 may have any number of switched capacitors $C_k$, and that $D_k$ might represent the kth bit of a larger control word ($D_0$ through $D_N$).

Nodes X1 through X4 may be coupled to nodes P0, P90, P180, and P270 in the quadrature VCO, respectively. When $D_k$ is "1," the MOS transistors M1 through M6 (which function as switches) are on, and nodes 300 through 303 are moved to the ground potential. Hence, the capacitors $C_k$ are switched into the LC tank (and the quadrature VCO will oscillate at a lower frequency).

When $D_k$ is "0," the MOS transistors are turned off, and nodes 300 through 303 are floating. As a result, the capacitors $C_k$ are switched out of the LC tank (and the quadrature VCO will oscillate at a higher frequency).

According to some embodiments, the MOS transistors M3 through M6 are sufficient to switch in (and out) the capacitors $C_k$. It may be, however, that the "on" resistance of the MOS transistors will contribute too much phase noise to the clock signals. To avoid this, the MOS transistors might be made large enough to reduce the "on" resistance for a given $C_k$. As the MOS transistors get larger, however, parasitic capacitance from the switches could also increase. Once parasitic capacitance becomes comparable to $C_k$, the effective capacitance being switched may be much smaller than $C_k$. In this case, the frequency step from each digital bit may be too small (making the tuning extension scheme impractical).

According to some embodiments, M1 and M2 are used to alleviate this problem. Since both M1 and M2 are in a differential configuration, the "on" resistance will be shared by the LC tank on the left and right. Compared with M3 through M6, M1 and M2 may contribute the same parasitic capacitance but only half "on" resistance. Thus, M1 and M2 may be made larger than M3 through M6.

Note that in this switch configuration, the large signal output swing on nodes P0, P90, P180, and P270 may rapidly force nodes 300 through 303 to a negative voltage. This may forward-bias the parasitic pn junctions at nodes 300 through 303 (which could cause electronic charges to be trapped in the pn junctions and slow down the speed of the switches). According to some embodiments, a delay cell 1100 is used in the switch to avoid such an effect. By introducing a delay, the center switch M1 and M2 will be turned off later than M3 through M6. This may help neutralize the charges stored between nodes 300 and 301 (and between 302 and 303).

System

Figure 12:
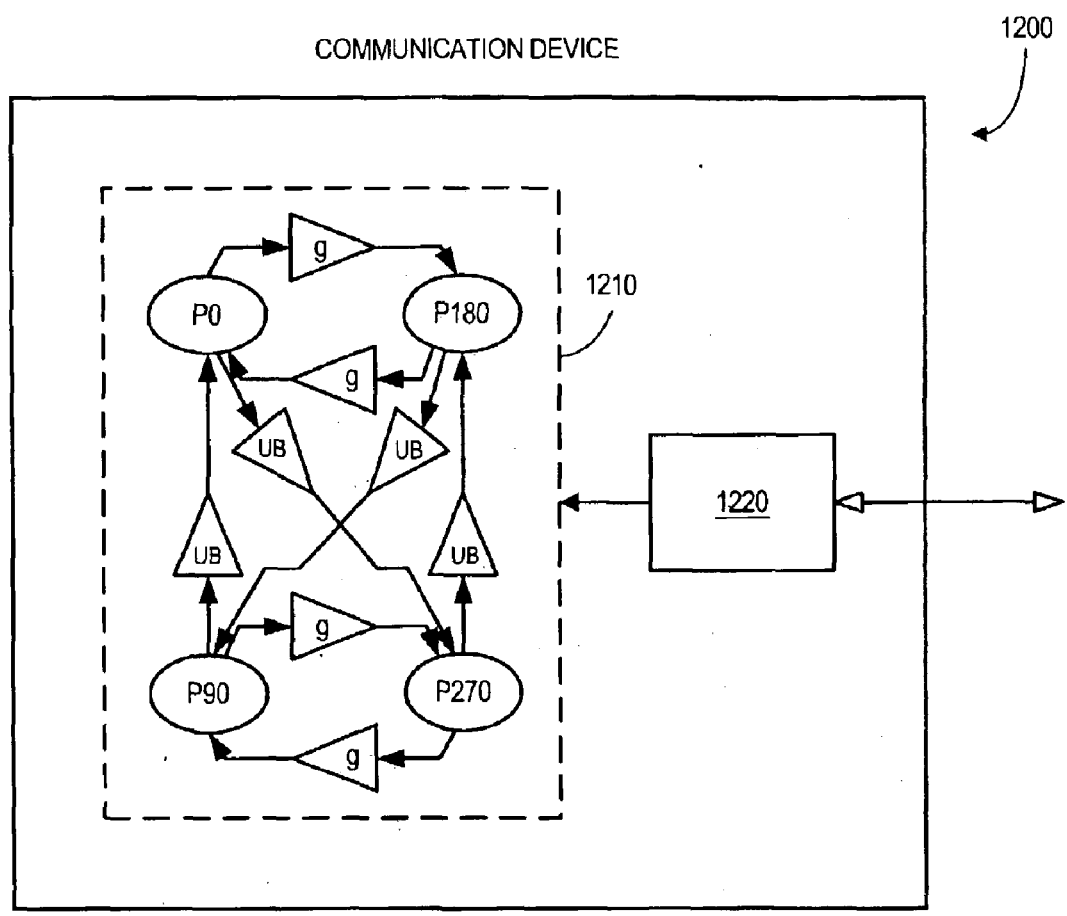
FIG. 12 is a block diagram of a system according to some embodiments.

FIG. 12 is a block diagram of a system 1200 according to some embodiments. In particular, the system 1200 includes a device 1210 that generates clock signals with a quadrature VCO in accordance with any of the embodiments disclosed herein. The device 1210 may be associated with, for example, a receiver, a transmitter, an optical communication device (e.g., a 10 GHz SONET receiver), and/or a wireless communication device. The system 1200 may further include a communication port 1220 adapted to exchange information via a network. For example, the system 1200 may comprise a wireless communication device (e.g., associated with a direct down-conversion wireless transceivers or a cellular system), in which case the communication port 1220 might be associated with an antenna.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although a particular design for a unilateral buffer was described herein, other designs may be used according to other embodiments. Similarly, a digitally switched capacitor array having any number of cells (including a single cell) may be used in accordance with the embodiments described herein. Moreover, either (or both) of the unilateral coupling and/or digitally switched capacitor array embodiments might be provided.

The several embodiments described herein are solely for the purpose of illustration. Persons skilled in the art will recognize from this description other embodiments may be practiced with modifications and alterations limited only by the claims.

What is claimed is:

1. An apparatus, comprising:
    a first voltage controlled oscillator having a 0 degree phase node and a 180 degree phase node; and
    a second voltage controlled oscillator having a 90 degree phase node and a 270 degree phase node,
    wherein the first and second voltage controlled oscillators are mutually coupled with substantially unilateral cascaded common-source common-gate amplifier coupling devices to create a quadrature voltage controlled oscillator.

2. The apparatus of claim 1, wherein the coupling devices are provided from: (i) the 0 degree phase node to the 270 degree phase node, (ii) the 270 degree phase node to the 180 degree phase node, (iii) the 180 degree phase node to the 90 degree phase node, and (iv) the 90 degree phase node to the 0 degree phase node.

3. The apparatus of claim 2, wherein the coupling devices are substantially unilateral buffers.

4. The apparatus of claim 1, wherein each amplifier is associated with a metal oxide semiconductor transistor.

5. The apparatus of claim 1, further comprising:
    a first inductor-capacitor tank coupled to the first voltage controlled oscillator; and
    a second inductor-capacitor tank coupled to the second voltage controlled oscillator.

6. The apparatus of claim 5, further comprising:
    a digitally controlled capacitor array coupled in parallel with the first and second inductor-capacitor tanks.

7. The apparatus of claim 6, further comprising:
    a selection unit coupled to the digitally controlled capacitor to select a center frequency for the quadrature voltage controlled oscillator.

8. The apparatus of claim 6, wherein the digitally controlled capacitor array comprises a set of digitally switched capacitors.

9. The apparatus of claim 8, wherein at least some of the digitally switched capacitors are associated with a delay cell.

10. The apparatus of claim 6, wherein the digitally controlled capacitor array is to provide a course frequency adjustment and a variable bias current is to provide a fine frequency adjustment for the quadrature voltage controlled oscillator.

11. The apparatus of claim 1, wherein the quadrature voltage controlled oscillator is associated with at least one of: (i) clock generation, (ii) clock recovery, (iii) a receiver, (iv) a transmitter, (v) an optical communication device, or (vi) a wireless communication device.

12. An apparatus, comprising:
a first voltage controlled oscillator having a 0 degree phase node and a 180 degree phase node;
a second voltage controlled oscillator having a 90 degree phase node and a 270 degree phase node, wherein the first and second voltage controlled oscillators are mutually coupled to create a quadrature voltage controlled oscillator;
a first inductor-capacitor tank coupled to the first voltage controlled oscillator;
a second inductor-capacitor tank coupled to the second voltage controlled oscillator; and
a digitally controlled capacitor array coupled in parallel with the first and second inductor-capacitor tanks.

13. The apparatus of claim 12, further comprising:
a selection unit coupled to the digitally controlled capacitor to select a center frequency for the quadrature voltage controlled oscillator.

14. A system, comprising:
a device with a clock generation circuit that includes:
a first voltage controlled oscillator having a 0 degree phase node and a 180 degree phase node; and
a second voltage controlled oscillator having a 90 degree phase node and a 270 degree phase node,
wherein the first and second voltage controlled oscillators are mutually coupled with substantially unilateral cascaded common-source common-gate amplifier coupling devices to create a quadrature voltage controlled oscillator; and
a communication port coupled to the device and adapted to exchange information via a communication network.

15. The system of claim 14, wherein the coupling devices are provided from: (i) the 0 degree phase node to the 270 degree phase node, (ii) the 270 degree phase node to the 180 degree phase node, (iii) the 180 degree phase node to the 90 degree phase node, and (iv) the 90 degree phase node to the 0 degree phase node.

16. The system of claim 14, wherein the coupling devices are substantially unilateral buffers.

17. An apparatus, comprising:
a first voltage controlled oscillator having a 0 degree phase node and a 180 degree phase node;
a second voltage controlled oscillator having a 90 degree phase node and a 270 degree phase node, wherein the first and second voltage controlled oscillators are mutually coupled with substantially unilateral coupling devices to create a quadrature voltage controlled oscillator;
a first inductor-capacitor tank coupled to the first voltage controlled oscillator;
a second inductor-capacitor tank coupled to the second voltage controlled oscillator; and
a digitally controlled capacitor array coupled in parallel with the first and second inductor-capacitor tanks.

18. The apparatus of claim 17, wherein the coupling devices are provided from: (i) the 0 degree phase node to the 270 degree phase node, (ii) the 270 degree phase node to the 180 degree phase node, (iii) the 180 degree phase node to the 90 degree phase node, and (iv) the 90 degree phase node to the 0 degree phase node.

19. The apparatus of claim 17, wherein the coupling devices are substantially unilateral buffers.

20. The apparatus of claim 17, further comprising:
a selection unit coupled to the digitally controlled capacitor to select a center frequency for the quadrature voltage controlled oscillator.

21. The apparatus of claim 17, wherein the digitally controlled capacitor array comprises a set of digitally switched capacitors.

22. The apparatus of claim 21, wherein at least some of the digitally switched capacitors are associated with a delay cell.

23. The apparatus of claim 17, wherein the digitally controlled capacitor array is to provide a course frequency adjustment and a variable bias current is to provide a fine frequency adjustment for the quadrature voltage controlled oscillator.

24. The apparatus of claim 17, wherein the quadrature voltage controlled oscillator is associated with at least one of: (i) clock generation, (ii) clock recovery, (iii) a receiver, (iv) a transmitter, (v) an optical communication device, or (vi) a wireless communication device.

* * * * *